US005776538A

United States Patent [19]

Pierle et al.

[11] Patent Number: 5,776,538

[45] Date of Patent: Jul. 7, 1998

[54] METHOD OF MANUFACTURE FOR MICROCHANNEL PLATE HAVING BOTH IMPROVED GAIN AND SIGNAL-TO-NOISE RATIO

[76] Inventors: Robert L. Pierle, 5131 E. Tonoko, Phoenix, Ariz. 85044; Mark Gilpin, 1515 N. Nebraska, Chandler, Ariz. 85224; Hubert G. Parish, 4305 W. Jupiter Way, Chandler, Ariz. 85226; Po-Ping Lin, 810 Lytton Ave., Palo Alto, Calif. 94301

[21] Appl. No.: 533,737

[22] Filed: Sep. 26, 1995

Related U.S. Application Data

[62] Division of Ser. No. 281,827, Jul. 28, 1994, Pat. No. 5,493,169.

[51] Int. Cl.[6] ............ B05D 5/12; C23C 16/00

[52] U.S. Cl. ............ 427/78; 427/77; 427/251; 427/255.5

[58] Field of Search ............ 427/77, 78, 567, 427/566, 248.1, 251, 255.5

[56] References Cited

U.S. PATENT DOCUMENTS

| | | | |
|---|---|---|---|
| 3,564,323 | 2/1971 | Maeda | 313/105 |
| 3,634,712 | 1/1972 | Orthuber | 313/103 |
| 3,974,411 | 8/1976 | Faulkner et al. | 313/105 |
| 4,051,403 | 9/1977 | Feingold et al. | 313/105 |
| 4,126,813 | 11/1978 | Orthuber | 315/11 |
| 4,153,855 | 5/1979 | Feingold | 427/553 |
| 4,469,719 | 9/1984 | Martin | 427/255.5 |
| 4,737,013 | 4/1988 | Wilcox | 350/96.27 |
| 4,886,996 | 12/1989 | Field et al. | 313/400 |
| 5,132,586 | 7/1992 | Boulais et al. | 313/105 |
| 5,159,231 | 10/1992 | Feller et al. | 313/103 |
| 5,268,612 | 12/1993 | Aebi et al. | 313/103 CM |

FOREIGN PATENT DOCUMENTS

| | | | |
|---|---|---|---|
| 691795 | 5/1953 | United Kingdom | 427/78 |

OTHER PUBLICATIONS

Lerner et al., ed; *Encyclopedia of Physics*, 2nd ed ; VCH Publishers, Inc. N.Y. 1991 (no month)—excerpts pp. 294–297, 1092–1094, 131–133.

*Primary Examiner*—Marianne Padgett

*Attorney, Agent, or Firm*—Terry L. Miller

[57] ABSTRACT

Microchannel plates for use in image intensifiers and night vision devices having both improved gain and signal-to-noise ratio are provided. The microchannel plates disclosed herein provide an initial electron impact area having a surface electron-emissivity coefficient greater than one (1) that is not occluded by low electron-emissivity conductive coatings. In one embodiment angulated deposition of a coating material is used to provide a high electron-emissivity initial electron-impact area while in another embodiment nonmetallic electrodes provide increased amplification of a signal electron. Besides improving gain and sensitivity, the microchannel plates of the present invention provide a higher signal-to-noise ratio, better resolution, high open area ratios and are significantly more cost effective to produce.

11 Claims, 2 Drawing Sheets

FIG. 1.
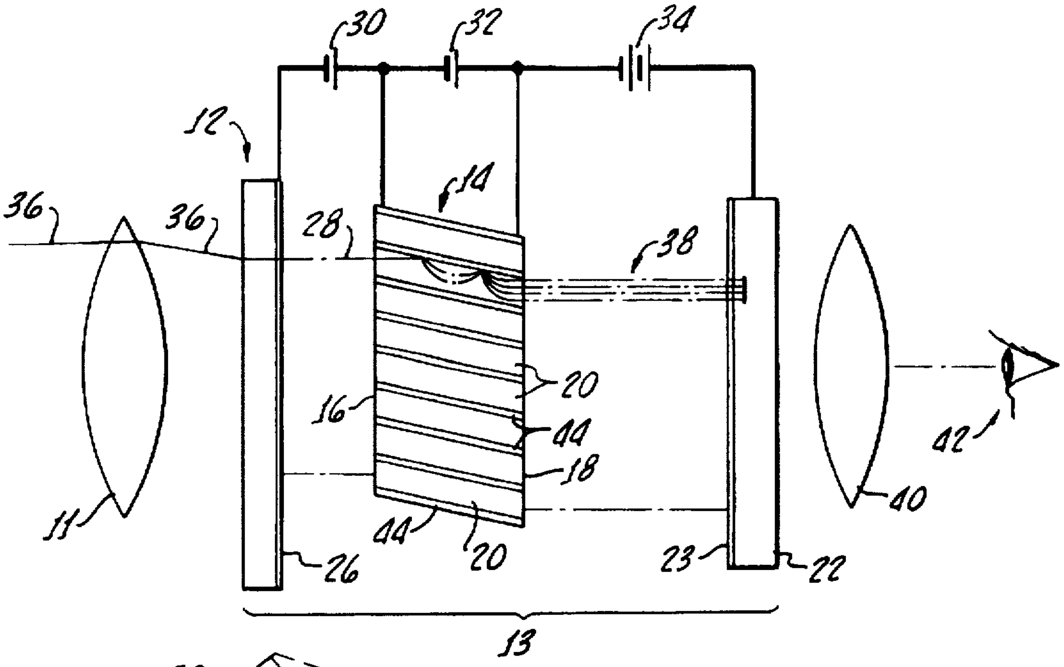
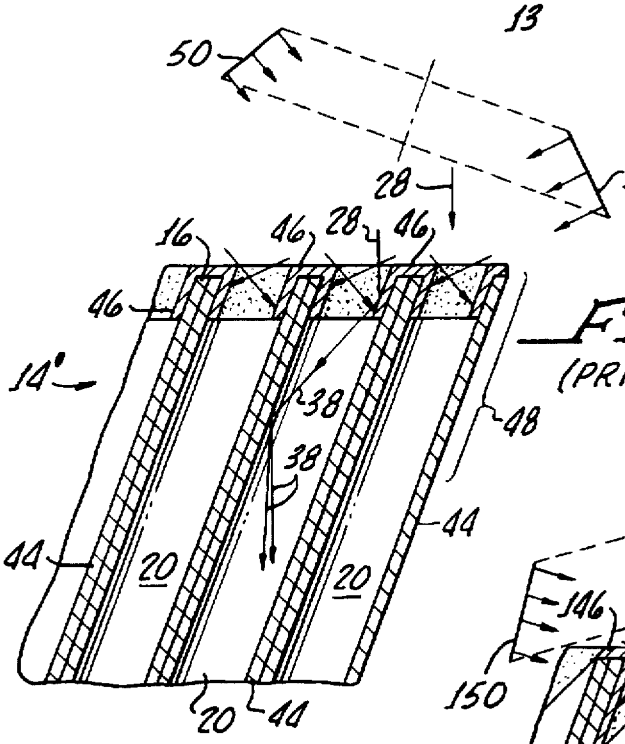
FIG. 2.
(PRIOR ART)
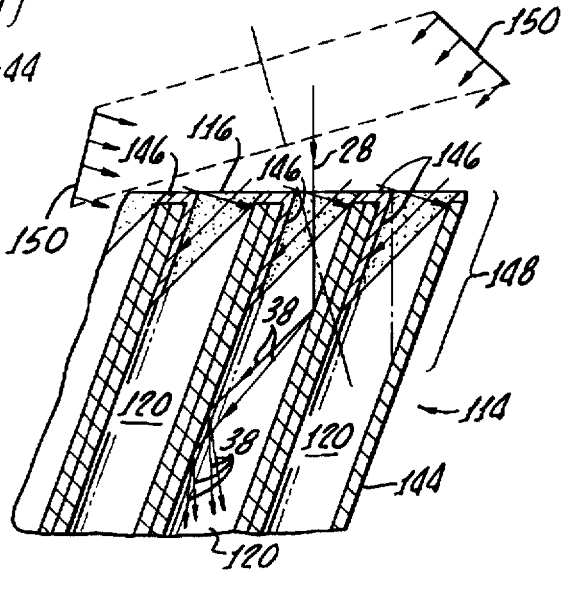
FIG. 3.

FIG. 4.
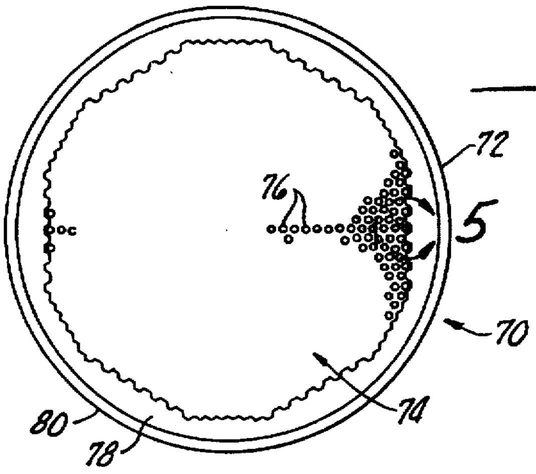
FIG. 5.
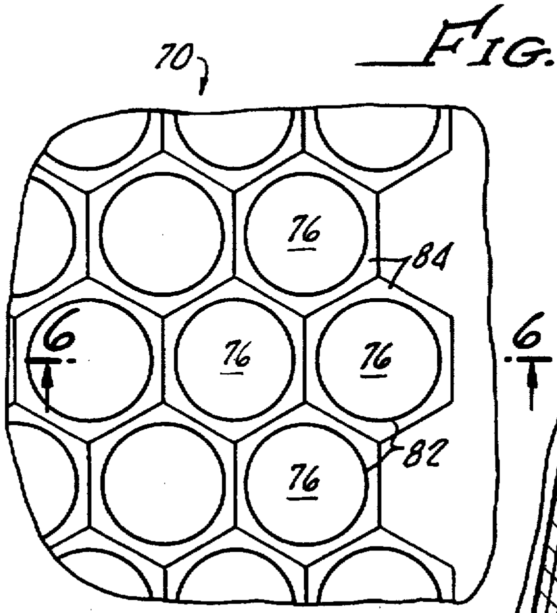
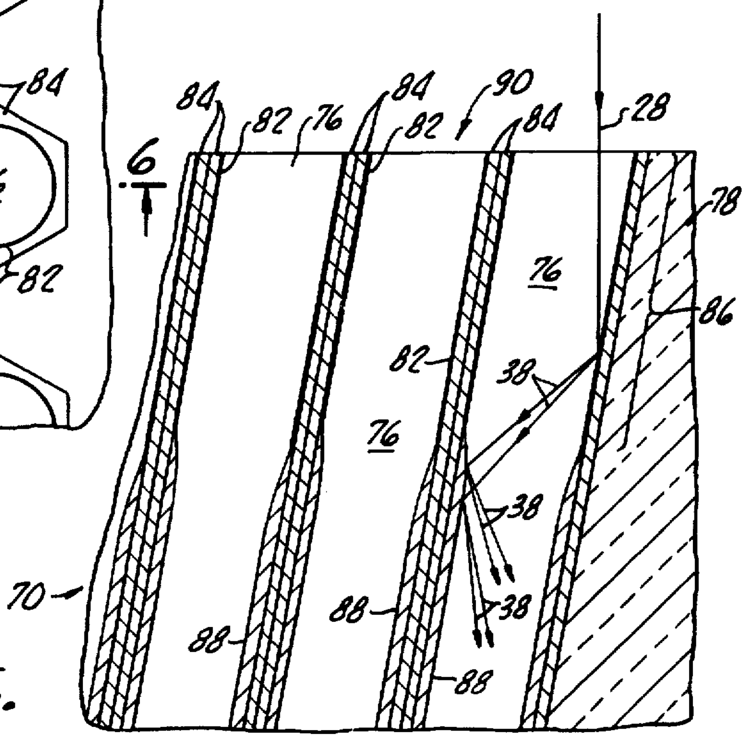
FIG. 6.

METHOD OF MANUFACTURE FOR MICROCHANNEL PLATE HAVING BOTH IMPROVED GAIN AND SIGNAL-TO-NOISE RATIO

This is a request for filing a Divisional application under 37 CFR 1.60, of pending prior application Ser. No. 08/281,827 filed on Jul. 28, 1994, now U.S. Pat. No. 5,493,169 issued Feb. 20, 1996.

FIELD OF THE INVENTION

The present invention relates in general to improved microchannel plates and methods of their manufacture. More particularly, the present invention relates to microchannel plates which have both improved electron gain and signal-to-noise ratio which may be used for image amplification.

BACKGROUND OF THE INVENTION

A night vision system converts available low intensity ambient light to a visible image. These systems require some residual light, such as moon or star light, in which to operate. This light is generally rich in infrared radiation, which is invisible to the human eye. The ambient light is intensified by the night vision scope to produce an output image which is visible to the human eye. The present generation of night vision scopes use image intensification technology and, in particular, microchannel plates to amplify the low level of visible light and to render a visible image from the normally invisible infrared radiation. The image intensification process involves conversion of the received ambient light into electron patterns and the subsequent projection of the electron patterns onto a receptor to produce an image visible to the eye. Typically, the receptor is a phosphor screen which is viewed through a lens provided as an eyepiece.

Specific examples of microchannel plate amplification are found in the image intensifier tubes of the night vision devices commonly used by police departments and by the military for night time surveillance, and for weapon aiming. However, microchannel plates may also be used to produce an intensified electrical signal indicative of the light flux or intensity falling on a photocathode, and even upon particular parts of the photocathode. The resulting electrical signals can be used to drive a video display, for example, or be fed to a computer for processing of the information present in the electrical analog of the image.

In night vision devices, a photoelectrically responsive photocathode element is used to receive photons from a low light level image. Typically the low light level image is far too dim to view with unaided natural vision, or may only be illuminated by invisible infrared radiation. Radiation at such wavelengths is rich in the nighttime sky. The photocathode produces a pattern of electrons (hereinafter referred to as "photoelectrons") which correspond with the pattern of photons from the low-level image. Through the use of electrostatic fields, the pattern of photoelectrons emitted from the photocathode are directed to the surface of a microchannel plate.

The pattern of photoelectrons is then introduced into a multitude of small channels (or microchannels) opening onto the surface of the plate which, by the secondary emission of electrons, produce a shower of electrons in a pattern corresponding to the low-level image. That is, the microchannel plate emits from its microchannels a proportional number of secondary emission electrons. These secondary emission electrons form an electron shower thereby amplifying the electrons produced by the photocathode in response to the initial low level image. The shower of electrons, at an intensity much above that produced by the photocathode, is then directed onto a phosphorescent screen. The phosphor of the screen produces an image in visible light which replicates the low-level image. Understandably, because of the microchannel plate, the representative image is pixelized, or is a mosaic of the low-level image.

More particularly, the microchannel plate itself conventionally is formed from a bundle of very small cylindrical tubes which have been fused together into a parallel orientation. The bundle is then sliced to form the microchannel plate. These small cylindrical tubes of the bundle thus have their length arranged generally along the thickness of the microchannel plate. That is, the thickness of the bundle slice or plate is not very great in comparison to its size or lateral extent; however, the microchannels individually are very small so that their length along the thickness of the microchannel plate is still many times their diameter. Thus, a microchannel plate has the appearance of a thin plate with parallel opposite surfaces.

The plate may contain millions of microscopic tubes or channels communicating between the faces of the microchannel plate. Each tube forms a passageway or channel opening at its opposite ends on the opposite faces of the plate. Further, each tube is slightly angulated with respect to a perpendicular from the parallel opposite faces of the plate so that electrons approaching the plate perpendicularly can not simply pass through one of the many microchannels without interacting with the interior surfaces.

Internally the many channels of a microchannel plate are each defined by or are coated with a material having a high propensity to emit secondary electrons when an electron falls on the surface of the material. In addition, the opposite faces of the microchannel plate are conventionally provided with a conductive metallic electrode coating so that a high electrostatic field can be applied across the plate. As previously indicated, an electrostatic field is also applied between the photocathode and the microchannel plate to move the photoelectrons emitted by the photocathode to the microchannel plate. Consequently, electrons produced by the photocathode in response to photons from an external image travel to the microchannel plate in an electron pattern corresponding to the received pattern of low-level light. These electrons enter the channels of the microchannel plate and strike the angulated walls which are coated with the secondary electron emissive material. Thus, the secondary emission electrons in numbers proportional to the number of photoelectrons, exit the channels of the microchannel plate to impinge on a phosphorescent screen. An electrostatic field between the microchannel plate and the phosphor screen accelerates the electrons to the screen producing an intensified mosaic image of the low-level scene.

Rather than directing the electron shower from a microchannel plate to a phosphorescent screen to produce a visible image, the shower of electrons may be directed upon an anode in order to produce an electrical signal indicative of the light or other radiation flux incident on the photocathode. The electrical analog signal may be employed to produce a mosaic image by electrical manipulation for display on a cathode ray screen, for example. Still alternatively, such a microchannel plate can be used as a "gain block" in a device having a free-space flow of electrons. That is, the microchannel plate provides a spatial output pattern of electrons which replicates an input pattern, and at a considerably higher electron density than the input pattern. Such a device is useful as a particle counter to detect high energy particle interactions which produce electrons.

Regardless of the data output format selected, the sensitivity of the image intensifier or other device utilizing a microchannel plate is directly related to the amount of electron amplification or "gain" imparted by the microchannel plate. That is, as each photoelectron enters a microchannel and strikes the wall, secondary electrons are knocked off or emitted from the area where the photoelectron initially impacted. The physical properties of the walls of the microchannel are such that, generally, a plurality electrons are emitted each time these walls are contacted by one energetic electron. In other words, the material of the walls has a high coefficient of secondary electron emission or, put yet another way, the electron-emissivity of the walls is greater than one.

Propelled by the electrostatic field across the microchannel plate, the secondary electrons travel toward the far surface of the microchannel plate away from the photocathode and point of entry. Along the way, each of the secondary electrons repeatedly interact with the walls of the microchannel plate resulting in the emission of additional electrons. Statistically, some of the electrons are absorbed into the material of the microchannel plate so that the photoelectrons do not generally escape the plate. However, the secondary electrons continue to increase or cascade along the length of the microchannels. These electrons in turn promote the release of yet additional electrons farther along the microchannel tube. The number of electrons emitted thus increases geometrically along the length of the microchannel to provide a cascade of electrons arising from each one of the original photoelectrons which entered the tube. As discussed above, this electron cascade then exits the individual passageways of the microchannel plate and, under the influence of another electrostatic field, is accelerated toward a corresponding location on a display electrode or phosphor screen. The number of electrons emitted from the microchannel, when averaged with those emitted from the other microchannels, is equivalent to the theoretical amplification or gain of the microchannel plate.

While the intensity of the original image may be amplified several times, various factors can interfere with the efficiency of the process thereby lowering the sensitivity of the device. For example, one inherent problem of microchannel plates is that a photoelectron released from the photocathode may not fall into one of the slightly angulated microchannels but impacts the bluff conductive face of the plate in a region between the openings of the microchannel tubes. Electrons that hit the metallized conductive face are likely to be deflected or bounce back toward the photocathode before being directed back to the microchannel plate by the electrostatic field. Such bounced photoelectrons, which then produce a number of secondary electrons from a part of the microchannel plate not aligned with the proper location of photocathode generation, decrease the signal-to-noise ratio, visually distorting the image produced by the image intensifier. Other times the errant electron is simply absorbed by the metallized conductive face of the plate and is not amplified to produce part of the image or signal produced by the detector anode.

Of course, one solution to this problem is to increase the amount of microchannel aperture area on the input face of the microchannel plate as was done in U.S. Pat. No. 4,737,013, issued 12 Apr. 1988, to Richard E. Wilcox. Through the use of an etching barrier around each microchannel, these particular microchannel plates have an improved ratio of total end open area of the microchannels to the area of the plate. Specifically, the etching barrier incorporated in the plate allows more precise etching of the microchannel tubes in the plate. The technique allows the plates to be produced with a theoretical open area ratio (OAR) of up to 90% of the plate active surface. As a result, the photoelectrons are not as likely to miss one of the microchannels and impact on the face of the microchannel plate to be bounced into another one of the microchannels. This higher OAR improves the signal-to-noise ratio of image intensification.

While the OAR may be improved using conventional methods, other factors still reduce the gain and decrease the signal-to-noise ratio of the conventional microchannel plate. In particular, coating the input face of the conventional microchannel plates with a conductive metallic electrode material significantly reduces the gain provided by a microchannel plate. Generally, the conductive metallic electrode materials on a statistical basis have an electron-emissivity coefficient of less than unity (i.e., less than one). More particularly, conventional deposition procedures for these metallic electrodes entail rotationally disposing the microchannel plate so that the axis of the microchannels is parallel to an axis about which the microchannel plate may be rotated. A deposition source is angularly disposed relative to the axis of the microchannels at a distance from the input face of the plate. As the microchannel plate is rotated in a high vacuum, metallic material is evaporated from the source onto the microchannel plate.

Because the microchannel plate rotates about an axis which is parallel with the axis of the microchannels, the metallic material from the source coats not only onto the input face of the microchannel plate, but also for a distance into the microchannels themselves. The distance into the microchannels to which the metallic electrode material will coat is dependent upon the angulation of the source with respect to the axis of the microchannels themselves. Because the microchannel plate is rotated about an axis parallel to the axis of the microchannels during deposition of the metallic electrode coating, the depth of metallic coating penetration into the microchannels is substantially uniform circumferentially about the microchannels. That is, the angulation of the microchannels relative to the evaporation source is held constant to produce uniform depth of penetration of the metallic electrode coating into the channels.

As a result, in addition to covering the face of the microchannel plate, the conductive electrode coating extends into the individual microchannels of the plate, covering a substantial part of the entrance surface portion of each microchannel which would be visible (on a microscopic scale) if one were to look into the microchannels perpendicularly to the face of the plate. Accordingly, while conventional processes and methods for deposition of the metallic conductive electrode material renders the parallel faces of the microchannel plates sufficiently conductive, the unavoidable coating of the inner entrance portion surfaces of the microchannels themselves unavoidably interferes with amplification of photoelectrons due to the low electron-emissivity coefficient of the coating material.

Moreover, the deposition of the coating material, performed in a vacuum under very exacting conditions and requiring specialized fixtures, is the single-most expensive manufacturing step in the production of conventional microchannel plates Typical microchannel plate coating materials are metallic and have a electron-emissivity coefficient of less than unity (i.e., less than 1). That is, a photoelectron striking the metallic conductive coating will not release more than one secondary electron as it is absorbed. Statistically, these metallic conductive electrode materials have an electron-emissivity of about 0.8. Accordingly, about twenty percent of the photoelectron signal that hits the metallized surface of the microchannel plate is immediately lost to the conductive electrode coating within the entrance portion of the microchannels. This lost signal value can not be amplified in the microchannel plate, and cannot contribute to output from the microchannel plate. Thus, the sensitivity of the microchannel plate is decreased.

More particularly, an electron, whether a photoelectron or secondary electron, which strikes the conductive metallic electrode coating may be absorbed without releasing any subsequent electrons from the material. As such, when an electron emitted from a photocathode strikes the conductive coating on the surface of a microchannel, there is no initial amplification and the electron may be absorbed without resulting in the emission of even a single secondary electron. This secondary electron, if it were emitted, could be multiplied subsequently in the microchannel and would contribute to the output of the microchannel plate. With no amplification by the emission of secondary electrons in the entrance portion of the microchannel plate, the microchannels have essentially been shortened by the length covered with the conductive electrode coating. No amplification by emitted secondary electrons will occur until the initial photoelectron (or its substitute) passes beyond the conductive material deposited in the microchannel.

However, the solution to this problem is not as simple as simply increasing the length of the microchannels so as to extend the length over which the secondary electron emission process is effective. At first blush, it would seem that the gain of a microchannel plate could be increased indefinitely simply by making the plate thicker. However, a microchannel plate cannot simply be made thicker because doing so severely and adversely affects the signal-to-noise ratio of the microchannel plate. The reason for this prohibition against increasing the thickness of a microchannel plate to increase its gain can be understood when one considers the statistical effects involved in emission of secondary electrons within the microchannels.

Each time an electron impacts the wall of a microchannel, there is a probability of the electron causing the emission of one or more secondary electrons. For the metallic electrode material, which is on the entrance portions of the microchannels of conventional microchannel plates, this probability coefficient is about 0.8. Thus, there is some electron signal loss and loss of amplification length for the microchannel plate because of this metallic electrode material at the entrance portion of the microchannels. For the material along the remaining length of the microchannels, the secondary electron-emissivity is greater than one, and the statistical process results in an increase in the number of electrons moving along the channels from the entrance end to outlet end. However, each time an electron impacts the walls of a microchannel, there is also the statistical probability that a positive ion will be released. When a positive ion is released, it travels in the opposite direction to the electron flow along the microchannel because of the prevailing electrostatic field. As a positive ion travels toward the entrance end of a microchannel, it also will impact and interact with the walls of the channel. Similarly to an electron, a positive ion has a probability of causing emission of secondary electrons.

Secondary electrons which are emitted because of positive ions moving toward the inlet end of a microchannel plate represent noise in the output of the microchannel plate. A point of diminishing returns is reached if a microchannel plate is increased in thickness beyond a certain length-to-diameter ratio for the microchannels. Further increase in the thickness of the microchannel plate results in little or no increase in gain because of space-charge saturation. If the voltage across the microchannel plate is increased to overcome the space-charge saturation limit, the probability of emission of positive ions increases faster than the emissivity of electrons. As a result, the signal-to-noise ratio of the thicker microchannel plate is severely decreased.

Accordingly, it is an object of the present invention to provide an improved microchannel plate having both increased electron-emission gain and an improved signal-to-noise ratio.

Another object for this invention is to provide such an improved microchannel plate which does not require the application of a metallic electrode coating to an active microchannel area of the plate.

It is yet another object of the present invention to provide an image intensifier tube which incorporates such an improved microchannel plate.

SUMMARY OF THE INVENTION

These and other objectives are achieved by the microchannel plates of the present invention which, in a broad aspect, provide microchannels having an entrance portion for initial photoelectron impact with relatively high electron-emissivity. That is, the area immediately inside the entrance opening of a microchannel, or entrance portion where a photoelectron emitted from the photocathode and moving perpendicular to the electron receiving face first collides with the wall of the microchannel, is formed of material which is a good secondary electron emitter (i.e. a material having a surface electron-emissivity coefficient greater than one).

Moreover, the surface of the microchannel plates of the present invention may be formed of nonmetallic materials exhibiting sufficient conductivity to establish an electrostatic field across the thickness of the microchannel plate. Such plates eliminate the need for the expensive deposition of a separate conductive metallic layer on the active microchannel area of the microchannel plate in order to provide electrodes on these opposite faces of the microchannel plate.

Further, unlike conventional microchannel plates where a portion of the initial electron-impact area is a metal or other poor secondary electron emitter, the microchannels of the present invention provides an increase in immediate amplification of the electron signal from the point of first electron contact with a wall of the microchannel. In turn, this increases the efficiency and amount of electron gain of the microchannel plate without adverse effect on the signal-to-noise ratio of the microchannel plates of the present invention. In fact, because the gain and resulting output of the present inventive microchannel plates are increased in comparison with conventional microchannel plates without an increase in thickness and noise production of the plate, the signal-to-noise ratio of the present microchannel plates is much better than conventional microchannel plates.

In one aspect of the present invention, microchannel plates having improved gain may be formed by depositing a conductive layer, typically of a metallic material, at a controlled and circumferentially varying angle relative to the central axis of the microchannels of the plate. Unlike conventional microchannel plates where the conductive layer is deposited from an evaporation source disposed at a fixed angle with respect to the central axis of the microchannels, the deposition of the conductive material on the input face and on a part of the entrance portion of the microchannels of the present inventive plates is conducted with a controlled circumferential variation of the angulation relative to the axis of the microchannels. This controlled angulation of material deposition does not coat the high-emissivity electron-impact area in the entry portion of the microchannels which is visible with perpendicular line-of-sight view into the inlet face of the microchannel.

More specifically, the present inventive microchannel plates are rotationally disposed relative to an evaporative source of the metallic electrode material so that the central axis of the microchannels is angulated relative to the axis of rotation, and further is angulated away from this axis of rotation in the same direction and in the plane which the microchannels define with the entrance face of the plate. This angulation of the microchannel plate relative to the evaporative source of metallic electrode material is precisely opposite to the conventional angulation. Thus, the evaporative source coats the entrance face of the plate without coating the high-emissivity initial electron-impact area within each microchannel. Rather, conductive material entering the microchannels will be deposited on the "shaded" or non-impact area of the internal microchannel wall.

That is, the conductive material will be deposited on the interior surfaces of the angulated microchannel that are occluded or blocked from a perpendicular line of sight view into the microchannel because of the angulation of the microchannel itself relative to the face of the plate. Specifically, the shaded area is obstructed by the angulated opening of the microchannels. Because the photoelectrons emitted from the photocathode essentially enter the microchannels substantially along the perpendicular line of sight, the shaded portions of the microchannel plate correspond to non-impact areas. Accordingly, the electrons entering the microchannel will strike a surface formed of material having an electron-emissivity coefficient greater than one rather than striking a metallic coating material generally having an electron-emissivity coefficient less than one.

A microchannel plate according to the present invention may include a metallic electrode coating which extends conventionally into the electron-discharge ends of the microchannels. This extension of the metallic electrode material into the electron-discharge ends of the microchannels has some advantages so far as focusing the discharged electrons is concerned.

In another aspect of the present invention the microchannel plates are not coated with a separate conductive material to provide the necessary electrodes. Rather, the surface of the high electron-emissivity material used to define the opening of the microchannels is sufficiently conductive to act as an electrode portion at both the electron-receiving face and opposite electron-discharge face. Preferably the high electron-emissivity material used to form the inner surface of the microchannel is glass exposed to hydrogen gas under reducing conditions. In particular, lead glasses incorporating bismuth prove to be sufficiently conductive when treated in this manner while retaining their high electron-emissivity coefficient.

Because the microchannel surfaces are not coated with a metallic or other poor secondary electron emitter, any electrons entering the microchannel perpendicular to the planar electron-receiving face will strike a high electron-emissivity surface and immediately be amplified. At the same time, the conductive nonmetallic electrodes at the electron-receiving face and electron-discharge face provide for the substantially uniform application of an electrostatic potential across the thickness of the microchannel plate. As with conventional coated microchannel plates, the conductive electrode portions may be confined to the central portion of the plate or extend to the periphery.

Microchannel plates having nonmetallic electrode portions may be fabricated using a glass substrate with multiple angulated microchannels passing therethrough and opening on parallel substrate surfaces. The microchannels preferably have an interior surface defined by a tubular first cladding which opens onto the electron-receiving face and the electron-discharge face. A good secondary electron emitter, the interior surface of this first cladding is also a relatively good conductor following treatment with hydrogen gas under reducing conditions. A second tubular cladding, also a good secondary electron emitter, is generally disposed on the inner surface of the first cladding. The second, or interior cladding, is preferably disposed on the central portion of the microchannel leaving the highly conductive interior surface of the first cladding to define the entry and exit portions of the microchannel.

In another embodiment of the present invention conductive ions may be incorporated or implanted into the parallel faces of the microchannel plates to provide the necessary electrode portions and charge distribution while not adversely affecting the surface electron-emissivity coefficient of the treated material. The incorporated ions may be copper, gold, silver or the like.

Other objects, features, and advantages of the present invention will be apparent to those skilled in the art from a consideration of the following detailed description of preferred exemplary embodiments thereof taken in conjunction with the associated figures which will first be described briefly.

BRIEF DESCRIPTION OF THE DRAWINGS

FIG. 1 is a schematic representation of a night vision device incorporating an image intensifier tube with microchannel plate;

FIG. 2 is an enlarged cross-sectional portion of a conventional microchannel plate;

FIG. 3 is a cross-section of a microchannel plate according to the teachings of the present invention;

FIG. 4 is a plan view of a microchannel plate according to the teachings of the present invention;

FIG. 5 is an enlarged plan view of a section of the microchannel plate of FIG. 4; and FIG. 6 is a further enlarged fragmentary cross-section of a microchannel plate taken at line 6—6 of FIG. 5.

DETAILED DESCRIPTION OF THE INVENTION

While the present invention may be embodied in many different forms, disclosed herein are specific illustrative embodiments thereof that exemplify the principles of the invention. It should be emphasized that the present invention is not limited to the specific embodiments illustrated.

Referring first to FIG. 1, there is shown schematically the basic elements of a night vision device 10. Night vision device 10 generally comprises a forward objective illustrated schematically as a single lens 11, a focusing or eyepiece optic illustrated schematically as a single lens 40 and an image intensifier tube 13 between the two lenses. Image intensifier tube 13 comprises a photocathode 12, microchannel plate 14 and display electrode 22 having a phosphor coating or screen 23. More particularly, microchannel plate 14 is located just behind photocathode 12, with microchannel plate 14 having an electron-receiving face 16 and an opposite electron-discharge discharge face 18. Microchannel plate 14 further contains a plurality of angulated (i.e., not perpendicular to face 16, but slightly angulated relative to the perpendicular to this face 16) microchannels 20 which open on electron-receiving face 16 and electron-discharge face 18. Microchannels 20 are separated by passage walls 44. Display electrode 22, generally having a coated phosphor screen 23 is located behind microchannel plate 14 with phosphor screen 23 in visible communication with electron-discharge face 18. Display electrode 22 is typically formed of an optically transparent material. Focusing lens 40 is located behind display electrode 22 and allows an observer 42 to view a correctly oriented image corresponding to the initially received low level image.

As will be appreciated by those skilled in the art, the individual components of image intensifier tube 13 are all mounted and supported in a tube or chamber (not shown) having forward and rear transparent plates cooperating to define a chamber which has been evacuated to a low pressure. This evacuation allows any electrons to be transferred between the various components without atmospheric interference that could possibly decrease the signal-to-noise ratio.

As indicated above, photocathode 12 is mounted immediately behind objective lens 11 and before microchannel plate 14. Typically, photocathode 12 is a circular disk having a predetermined construction and mounted in a well known manner. Suitable photocathode materials are generally semiconductors such as gallium arsenide or rare earth metals, such as sodium, potassium, cesium, and antimony (commercially available as S-20), on a readily available substrate. A variety of glass and fiber optic substrate materials are commercially available.

Responsive to photons 36 entering the forward end of night vision device 10 and passing through objective lens 14, photocathode 12 has an active surface 26 which emits electrons in proportionately to the received optical energy. In general, the image received will be too dim to be viewed with the natural vision, and may be entirely or partially of infrared radiation which is invisible to the human eye. The shower of electrons emitted, hereinafter referred to as photoelectrons, are representative of the image entering the forward end of image intensifier tube 13. The shower of emitted photoelectrons is represented in FIG. 1 by dashed line 28.

Photoelectrons 28 emitted from photocathode 12 gain energy through an electric field of predetermined intensity gradient established between electron-receiving face 16 and photocathode 12 by electric source 30. Typically, electric source 30 will be on the order of 200 to 800 volts to establish an electrostatic field of the desired intensity. Upon acceleration and passing through the electrostatic field, photoelectrons 28 enter microchannels 20 of microchannel plate 14. As will be discussed in greater detail below, the photoelectrons are amplified to produce a proportionately larger number of electrons upon passage through microchannel plate 14. This amplified shower of secondary emission electrons 38, accelerated by an electrostatic field generated by electrical source 32, then exits microchannels 20 of microchannel plate 14 at electron-discharge face 18 and is again accelerated in an established electrostatic field. This electrostatic field is established by electric source 34 between electron-discharge face 18 and display electrode 22. Typically, electric source 34 produces a bias voltage on the order of 3,000 to 7,000 volts and more preferably on the order of 6,000 volts to impart the desired energy to the multiplied electrons 38.

The shower of secondary emission electrons 38, now several orders of magnitude more intense than the initial shower of photoelectrons 28 but still replicating the image focused on photocathode 12, falls on phosphor screen 23 of display electrode 22 to produce an image in visible light. It should be apparent that phosphor screen 23 acts as a means for converting the electron pattern generated by photocathode 12 to a visible light image of the initially received low level image. Following conversion to a visible light image, the information presented on phosphor screen 23 passes through focusing lens 12 to provide an observer 42 with the desired image.

As seen in FIG. 1 a photon 36 passes through objective lens 11 striking photocathode 12 and causing the emission of an electron 28 from active surface 26 as detailed previously. Also shown in FIGS. 2 and 3, electron 28, accelerated toward microchannel plate 14 by the electrostatic gradient produced by source 30, approaches microchannels 20 perpendicular to planar electron-receiving face 16. That is electron 28, under the influence of the external electrostatic field, traverses the distance between active surface 26 and angulated microchannels 20 opening on planar electron-receiving face 16. Upon reaching electron-receiving face 16, electron 28 enters a discrete microchannel 20 where it comes under the influence of an electrostatic field substantially uniformly distributed across microchannel plate 14 by source 32 (as seen in FIG. 1). Source 32 may have a voltage on the order of 200 to 1000 volts and is typically about 200 to 800 volts. The electrostatic field accelerates electron 28, and any secondary emission electrons 38, toward electron-discharge face 18 of microchannel plate 14.

Because multiple microchannels 20 are angulated with respect to electron-receiving face 16 and photoelectron 28 is accelerated by external electrostatic fields, it will impact the appropriate microchannel inner surface defined by passage walls 44. Generally the inner surface of each microchannel is formed of a high electron-emissivity material that is a good secondary electron emitter. Exemplary materials include leaded glasses which have been treated with hydrogen under reducing conditions. Typically such treated glasses have secondary electron-emissivity coefficients greater than one and often as high as 2.5 at average impact velocity. Thus, when an electron strikes these high electron-emissivity surfaces, it usually knocks out more than one additional secondary electron 38. These secondary electrons 38, as well as the initial photoelectron 28, are accelerated toward electron-discharge face 18 within microchannel 20 and, due to their random velocity vectors, strike the high electron-emissivity material of the inner surface the microchannel. As specifically illustrated in FIG. 1, the secondary electrons strike the high-emissivity material at subsequent locations to knock off even more secondary electrons in a cascading process. The multiplied electrons 38 then exit from the opening of microchannel 20 on electron-discharge face 16 and again are accelerated to strike phosphor screen 23 on display electrode 22 thereby producing a conventional light image as described above.

As is more clearly seen in FIG. 2 for purposes of comparison and contrast with the present invention, a conventional microchannel plate 14 is coated at face 16 with a thin layer of conductive material 46 which acts as an electrode to distribute the electric field provided by source 32 across at least a portion of the surface of electron-receiving face 16. Preferably, this coating of conductive material 46 is in the thickness range from about 1000 angstroms to about 3000 angstroms and is metallic in. For example, the coating 46 may be of conventional Nichrome (a chromium based, nickel containing alloy) or Inconel (for example, 76% nickel, 15.5% chromium, 7.5% iron, 0.25% silicon, 0.25% manganese, 0.2% copper, 0.08 carbon, 0.007% sulfur) metal alloy. Though not shown in FIG. 2, electron-discharge face 18 is similarly coated with a conductive material that also acts as an electrode. However, the conductive portion of microchannel plate 14' generally does not extend to outer peripheral edge (not shown). As a result, the peripheral edge portion of microchannel plate 14 is exposed and acts as an electrical insulator against shorting across the thickness of the plate. Through these electrodes of conductive material 46 and the corresponding coating on the opposite side of the microchannel plate, an electrostatic field is distributed across the thickness of the microchannel plate when source 32 is activated. The established electrostatic field of predetermined intensity between electron-receiving face 16 and electron-discharge face 18 is typically on the order of 600 to 1000 volts.

In order to assure an even deposition of conductive material 46 on the selected face and provide for the establishment of a uniform electrostatic field across microchannel plate 14', the microchannel plate 14' is rotationally disposed relative to the evaporation source 50. That is, the microchannel plate may be supported upon a turntable (not shown), and be angulated relative to the rotational axis of this turntable so that the microchannel plate is tipped in the direction of the angulation of the microchannels 20 relative to the electron receiving face 16. This position of the conventional microchannel plate 14 on the turntable makes the source 50 appear to orbit (i.e., as the microchannel plate turns with the turntable) in a plane which is generally perpendicular to the axis of the microchannels 20 viewing FIG. 2. For the purposes of this discussion the procedure are directed to coating electron-receiving face 16 although the same principles will apply to coating electron-discharging face 18.

Further, for purposes of comparison, and restatement viewing FIG. 2 will show that when prior art vacuum deposition procedures are used to coat a conventional microchannel plate 14', the plate is angulated so that a central axis of the microchannels is parallel to an axis of rotation. A source 50 of metallic electrode material is angulated off-axis relative to the axis of rotation and relative to the central axis of the microchannels. Consequently, when the microchannel plate 14' is rotated during evaporation of material from source 50, this source appears to orbit relative to the plate 14' in a plane (indicated with the dashed lines on FIG. 2) which is perpendicular to the central axis of the microchannels. Consequently, metallic electrode material coats not only onto the confronting face of the microchannel plate, but also coats into the channels 20. The coating of the electrode material into the channels 20 is according to a generally conical projection, as is indicated by the crossed projection arrows on FIG. 2. Because the central axis of the microchannels is parallel with the axis of rotation, the angulation of the microchannels 20 relative to the face of the microchannel plate has little effect upon the depth to which the material from source 50 coats into the channels 20. Importantly, the material from source 50 coats onto at least a substantial portion of the entrance portion of the channels which is visible by perpendicular line of sight view into the channels. As pointed out above, this coating of the entrance portion of the microchannels reduces the gain of the microchannel plate.

That is, because the conductive coating materials, which are typically metallic, have low secondary electron-emissivity coefficients of less than one, there will be no initial amplification from an electron strike. Since the electron amplification cascade of an individual microchannel is geometric, the elimination of the initial amplification step significantly reduces the gain of the plate. That is, the omission of an amplification step at the electron-receiving end of the microchannel has a much greater effect on the ultimate gain of the plate than the elimination of an amplification step at the electron-discharge end of the microchannel. This is clearly illustrated in FIG. 2 where photoelectron 28 strikes conductive material 46 deposited on the high electron-emissivity inner surface of microchannel 20. Sometimes, upon striking the low electron-emissivity conductive material 46, photoelectron 28 will be absorbed. In most cases, but by no means all, a single secondary electron 38 may be ejected from conductive material 46. In any case there has been no amplification of the initial photoelectron, i.e. one electron has produced, at the most, one electron. Secondary electron 38 then travels down microchannel 20 directed by the imposed electrostatic field. Due to the random velocity vector imparted by the energy of the initial strike secondary electron 38 impacts the high electron-emissivity inner surface of microchannel releasing two additional secondary electrons 38. From here the amplification cascade proceeds as described above.

In contrast to the prior art embodiments shown in FIG. 2, FIG. 3 shows a section of an improved gain microchannel plate formed according to the present invention. In order to simplify the discussion herein reference numerals used in FIGS. 1 and 2, and increased by 100 will be used to describe corresponding features of FIG. 3. For example, microchannel plate 14 of FIGS. 1 and 2 will be referenced as microchannel plate 114 when discussing FIG. 3. It will further be appreciated by those skilled in the art that the other components of a night vision device or image intensifier tube incorporating the microchannel plate of FIG. 3 are substantially the same as shown in FIG. 1. Accordingly, the general principles and theories of night vision devices and image intensifier tubes previously described are applicable to the following discussion.

Turning now to FIG. 3, a microchannel plate 114 having both improved gain and improved signal-to-noise ratio is illustrated. Briefly, microchannel plate 114 is positioned in an image intensifier tube between a photocathode and display electrode as previously outlined. Further, electrostatic fields are established within the image intensifier tube and across microchannel plate as shown generally in FIG. 1. As with the embodiments previously illustrated, microchannel plate 114 has a plurality of angulated microchannels 120 defined by passage walls 144 and opening onto electron-receiving face 116. Angulated microchannels 120 further define an entry portion, shown by bracket 148, adjacent to the opening of microchannels 120 onto electron-receiving face 116. Although not shown, those skilled in the art will appreciate that angulated microchannels 120 extend through microchannel plate 114 to open on electron-discharge face 118.

As with prior art microchannel plate, microchannel plate 114 has a layer of conductive material 146 disposed on electron-receiving face 116. However, unlike the prior art microchannel plate previously discussed, conductive material 146 is not deposited from an evaporation source apparently orbiting perpendicularly to the central axis of the microchannels. Rather, the evaporation source 150 and microchannel plate 114 are positioned and relatively rotated so that the source 150 appears to orbit about the central axis of the microchannels with a circumferentially variable angulation. That is, the microchannel plate is tipped relative to the axis of rotation in the direction of and in the plane of the angulation of the microchannels relative to the surface 116, and is rotated relative to the source 150 so as to provide for the circumferentially varied angulation of deposition of conductive material 146.

The effect of this angulation of the microchannel plate 114 relative to the axis of rotation is to make the source 150 appear to orbit the microchannels with an angulation which varies circumferentially. The greatest angulation of the source 150 relative to the axis of the microchannels is achieved on the side where the microchannels are angulated acutely relative to the surface 116. On the other hand, the least angulation of the axis of the source 150 relative to the microchannels 120 is achieved on the side where the microchannels are angulated obtusely relative to the surface 116, viewing FIG. 3. As can be seen by the crossed projection arrows from source 150 into the microchannels 120, the material from the source can penetrate more deeply on the "shaded" side of the microchannels (with respect to a perpendicular line of sight view into the microchannels), and penetrates only a shallow distance (if at all) on the other side of the microchannels 120 at the entrance portion thereof.

That is, rather than being applied with a fixed angulation and with a substantially uniform depth into the microchannels 120, conductive material 146 from source 150 is applied to microchannel plate at a circumferentially variable angle based on the angulation of the microchannels themselves relative to the surface 116. By using this circumferentially varying angulated deposition of the electrode material, the necessary electrical conductivity may be established on the parallel microchannel plate faces without reducing the amplification potential of microchannels 120.

More particularly, as shown in FIG. 3, microchannels 120 define a first acute angle with electron receiving face 116. To obtain the desired angulated coating, evaporation source 150 is preferably positioned at a second acute angle relative to electron-receiving face 116. The angle formed by evaporation source 150 with the planar face 116 of microchannel plate 114 may be of any value less than that of the first acute angle defined by the intersection of microchannels 120 with electron-receiving face 116.

Specifically, a central axis of microchannels 120 delineates a first acute angle i.e. less than 90°, upon intersecting with electron-receiving face 116. This acute angle will be in the plane defined by the intersection of the microchannel central axis and the electron receiving surface. It will be appreciated by those skilled in the art that this first acute angle may be determined during the manufacture of microchannel plate 114 and can vary depending on the requirements of the plates. Typical values for this first acute angle range from approximately 60° to approximately 88°. For the purposes of the present invention, evaporation source 150 is preferably placed so that its apparent plane of orbit relative to the microchannels 120 defines an angle which complements the angulation of the microchannels relative to the surface 116. Further, the relative tip of the microchannel plate 114 relative to the plane of apparent orbit of the source 150 is in the same direction as and in the plane of the angulation of the microchannels 120 relative to the surface 116.

This circumferentially angulated deposition of conductive material 146 on microchannel plate 114 will provide a conductive layer on electron-receiving face 116 sufficient to act as an electrical contact to distribute an applied electrostatic field. Yet, unlike electrode coating applied with prior technology, coating layer 146 will not interfere with the initial photoelectron impact area substantially having a perpendicular line of sight relation with the opening of microchannels 120 on electron-receiving face 116. Rather, any conductive material 146 entering microchannels 120 will be deposited on the "shaded" area of entry portion 148 which is not in a perpendicular line of sight relation with the openings of microchannels 120. Accordingly, in the area of initial electron impact, the inner surface of microchannels 120 having a high secondary electron-emissivity coefficient will not be coated with low electron-emissivity conductive material 146.

Thus, electron amplification by microchannels 120 begins immediately upon impact of photoelectron 28 rather than being delayed until the second or third strike as seen in prior art microchannel plates. This immediate amplification essentially increases the usable microchannel length and gain of the plate without requiring an increase in the applied electrostatic field, and without physically expanding the thickness of the plate so that the noise created by the plate would be increased. Because the gain and signal output of the inventive microchannel plate is increased considerably without an increase in noise production, the signal-to-noise ratio of the inventive microchannel plate is considerably improved as well.

Specifically, photoelectron 28 is accelerated by the imposed electrostatic field and enters the opening of a microchannel 120 perpendicular to electron-receiving face 116. Upon penetrating entry portion 148 of angulated microchannel 120, photoelectron 28 strikes the surface of passage wall 144 within the area having a substantially perpendicular line of sight relation with the opening. As conductive coating material 146 has been only been applied to the "shaded" or non-impact area of entry portion 148, i.e. the area which does not have a perpendicular line of sight relation with the opening of microchannel 120, photoelectron 28 will initially strike a surface having a high secondary electron emission coefficient. Accordingly, the initial impact of photoelectron 28 will immediately be amplified as shown in FIG. 3 where two secondary electrons 38 are ejected downward, accelerated by the electrostatic field across microchannel plate 114. As the multiplied secondary electrons 38 from the initial impact subsequently strike the high electron-emissivity surface of microchannel 120 they will release further secondary electrons 38 to provide the geometric cascade as previously described. However, due to the initial amplification of photoelectron 28, the signal-to-noise ratio of microchannel plate 114 will be approximately twice that of a prior art microchannel plate coated using prior technology.

Viewing now FIGS. 4, 5 and 6, two frontal views and a greatly enlarged fragmentary cross-sectional view of a non-coated microchannel plate 70 are illustrated. In accordance with the teachings of the present invention, microchannel plate 70 does not have an applied coating of a conductive material. Rather plate surface portions are themselves sufficiently conductive to provide the necessary electrodes for distribution of the electrostatic voltage across the microchannel plate. Of course those skilled in the art will appreciate that the previously described general principles and theories of night vision devices, image intensifiers and microchannel plates are applicable to the discussion below. Accordingly, non-coated microchannel plate 70 may be incorporated and operated as previously illustrated.

It is seen that microchannel plate 70 is composed of a thin perforate disk 72 of glass having a central portion, indicated with the arrowed lead line 74 (viewing FIG. 4), defining a great multitude of small through passages or microchannels 76. Around, but not extending into this central active area 74 of microchannels, the plate 70 may optionally include an annular peripheral band 75 of metallic surface coating. This peripheral band 75 of metallic surface coating is effective to make electrical contact between the plate 70 and a contact member (not shown) connecting with a voltage source like that referenced with the numeral 32, as discussed above.

Shown more clearly in FIG. 5, microchannels 76 open on each of the opposite faces of microchannel plate 70. During fabrication of perforate disk 72, round fibers typically used to form individual microchannels 76 distort and mutually interbond to one another to provide the hexagonal shapes illustrated. As will be described in greater detail below, at least a portion of each of the opposite faces of microchannel plate 70 is conductive and acts to distribute an electrical field across the faces. However, the conductive portion of microchannel plate 70 generally does not extend across an outer peripheral edge portion 78 of disk 72. As a result, peripheral edge portion 78 and the outer edge 80 of the glass disk is exposed and acts as an electrical insulator against shorting across microchannel plate 70.

More particularly, non-coated microchannel plate 70 has a plurality of angulated microchannels 76 each having an entrance portion, indicated by bracket 86, defined by a first tubular cladding 84 which opens onto both the electron-receiving face 90 and the electron-discharge face (not shown). A second tubular cladding 88 is disposed on the inner surface of first cladding 84 except at the entrance portion 86. Preferably, first cladding 84 and second cladding 88 are formed of nonmetallic materials having a surface electron-emissivity coefficient greater than one. That is, both the first and second cladding are good secondary electron emitters. Moreover, first cladding surface 82 at entrance portion 86 is sufficiently conductive to function as an electrode at electron-receiving face 90 and the electron-discharge face (not shown).

Fabrication of microchannel plate 70 is typically accomplished by drawing and heating multiple fibers made up of tubular first cladding 84 concentrically arranged around second cladding 88 and a core (not shown), which is later removed by chemical etching. The fibers, bundled to form a rod, are heated, drawn and cut repeatedly until each fiber approaches the desired diameter, usually on the order of 3 μm to 20 μm. As will be appreciated by those skilled in the art the cladding and core must have compatible thermal expansion coefficients, viscosity and chemical durability to retain the proper configuration during deformation. During this process the bundles of fibers are fused together with adjacent layers of first cladding 84 forming the hexagonal shapes illustrated in FIG. 5. The higher softening temperatures of second cladding 88 and core maintain the cylindrical inner configuration of the fibers. The deformed bundles are then cut to form a plurality of disks 72, although microchannels 76 may not yet be present. The opposing parallel faces, i.e. electron-receiving face 90 and electron-discharge face (not shown) are arranged at a small angle, typically 3° to 20°, to the axis of the fibers to provide angulated microchannels 76.

Different chemical properties, in particular different resistances to acid etching, of first cladding 84, second cladding 88 and the core allow them to be selectively and discretely removed from the disk. Such a process is described more fully in U.S. Pat. No. 4,737,013 which is incorporated herein by reference.

Specifically, first cladding 84 is more resistant to acid etching than are second cladding 88 or the incorporated core glass. In a preferred fabrication procedure the core glass is etched with an acid bath to remove the material. The disk is then subjected to etching by hydrofluoric acid which etches away the second cladding adjacent to the opposing faces of the disk more quickly than the second cladding at a depth creating a funnel-like opening at each end of microchannels 76. At entrance portion 86 of microchannels 76 second cladding 88 is entirely removed leaving the surface of acid resistant first cladding 84 exposed. First cladding 84 prevents the acid from etching completely through the walls of microchannels 76 and destroying the integrity of the structure. Such fabrication methods allow the production of microchannel plates having high open area ratios at both opposing faces, thereby significantly improving the signal-to-noise ratio and resolution of the image.

Following the structural formation of microchannel plate 70, the surfaces are treated to provide the desired electrical properties. Unlike conventional microchannel plates, the materials used in the present invention, and in particular the material used for the first cladding, allow the parallel opposite faces of the microchannel plate to become conductive thereby obviating the need for a separately applied conductive coating. As vacuum deposition of the conductive material is often the single most expensive step in microchannel plate fabrication, its elimination can produce significant cost savings. Moreover, this conductivity of the first cladding does not interfere with the high surface electron-emissivity of the microchannels or corresponding gain of the microchannel plate.

Typically first cladding 84, second cladding 88 and the core material are formed of glass. In addition to being acid-resistant, surface 82 of first cladding 84 preferably exhibits the desired conductivity following appropriate chemical treatments. One glass particularly suitable for use as first cladding 84 in the present invention is a leaded glass sold by American Cystoscope Manufacturing Inc. ("ACMI," Stanford, Conn.) under the designation NS 23A. Besides being acid resistant and having a high surface electron-emissivity coefficient, this glass contains small amounts of bismuth which render first cladding surface 82 sufficiently conductive when treated with hydrogen gas under reducing conditions. That is, when first cladding surface 82 is exposed to a hydrogen atmosphere at elevated temperatures for a predetermined period the oxides in the glass surface are reduced making it conductive.

Second cladding 88, which is not required to exhibit high conductivity, may be selected based on other physical parameters such as acid resistance. For example second cladding 88 may be glass including lead oxide, silicon oxide, potassium oxide or rubidium oxide. A suitable glass for second cladding 88 is designated as NV-30 being sold by ACMI. Finally, the core glass incorporated during the fabrication of microchannel plate 70 will be chosen based on its ability to be completely removed by acid etching, and its other physical characteristics such as thermal expansion. One such suitable glass is sold by ACMI under the trade name NC-178.

Referring now to FIG. 6, entrance portion 86, defined by first cladding 84, incorporates highly conductive first cladding surface 82. While first cladding surface 82 is sufficiently conductive to act as an electrode and distribute an applied electrostatic field across electron receiving-face 90, the bulk of first cladding 84 remains relatively non-conductive and acts to prevent shorting between the individual microchannels 76. Further down microchannels 76, just beyond entrance portion 86, second cladding 88 is disposed on the inner surface of first cladding 84. Due to the particulars of the etching procedure second cladding 88 funnels inward from first cladding surface 82. While second cladding 88 is a good secondary electron emitter it is not required to be particularly conductive even when its surface is exposed to hydrogen. Of course the deposition of second cladding 88 prevents the inner surface of first cladding 84 underneath from being exposed to hydrogen and becoming conductive like first cladding surface 82 in entrance portion 86. Moreover, though not shown it should be appreciated that the ends of microchannels 76 adjacent to the electron-discharge face exhibit a similar configuration.

As with the previously discussed night vision devices and image intensifiers, photoelectron 28 approaches microchannel plate 70 perpendicularly with respect to planar electron-receiving face 90. Due to the high open area ratio of the plate, photoelectron 28 enters angulated microchannel 76 and strikes first cladding surface 82. As first cladding surface 82 has a high surface electron-emissivity coefficient, two secondary electrons 38 are ejected amplifying the initial impact. It should be noted that had photoelectron 28 initially struck second cladding 88 the same effect would have been observed. As the cladding surfaces may have a surface electron-emissivity coefficients on the order of 2.5, it is possible that the amplification of this initial impact could provide a gain increase of 250% and an improved signal-to-noise ratio over conventional microchannel plates, in which photoelectrons 28 initially strike a conductive coating having a surface electron-emissivity coefficient less than one. Accelerated by the electrostatic field established using the highly conductive first cladding surface 82, amplified secondary electrons 38 travel down microchannel tube 76 subsequently releasing proportionately more electrons. The cascading secondary electrons 38 eventually pass from microchannel 76 at the opening in the electron-discharge face and are received and registered by the phosphor screen of the display electrode.

In another embodiment of the present invention, the microchannel entrance portion of microchannel plates shown in FIGS. 1, and 3–6 may be rendered conductive by ion implantation or incorporation adjacent to, and on, the electron-receiving face. That is, the opposite faces of a conventional un-coated microchannel plate or those formed according to the teachings of the present invention may be rendered more conductive by incorporating metallic ions into the glass substrate. This ion implantation may be used to increase the conductivity of uncoated conventional microchannel plates as well as with the other embodiments of the present invention.

Unlike a conventional conductive coating, this ion implantation will not conceal the initial impact area having a high surface electron-emissivity coefficient thereby allowing amplification of the signal from the first photoelectron impact. However the incorporated ions, which can be copper, gold, silver or the like will provide sufficient conductivity to distribute an applied electric field over the parallel faces thereby establishing an electrostatic field across the microchannel plate.

Of course, those skilled in the art will appreciate that the various embodiments of the present invention enumerated above are not mutually exclusive and may be used in any combination to provide microchannel plates having the desired characteristics. For example, microchannel plates having a nonmetallic electrode on the electron-receiving side may have conventional conductive coating or one applied by angle deposition on the electron-discharge face. Similarly, a microchannel plate having nonmetallic electrodes on both faces may incorporate conductive ions on one or both faces to alter the conductivity parameters. In all cases the gain or amplification of the microchannel plate will be improved without compromising the necessary distribution of electrical field on the opposing faces of the plate.

Those skilled in the art will further appreciate that the present invention may be embodied in other specific forms without departing from the spirit or central attributes thereof. In that the foregoing description of the present invention discloses only exemplary embodiments thereof, it is to be understood that other variations are recognized as being within the scope of the present invention. Accordingly, the present invention is not limited to the particular embodiments which have been described in detail herein. Rather, reference should be made to the appended claims to define the scope and content of the present invention.

What is claimed is:

1. A method for fabricating a microchannel plate having plural microchannels each with an entrance portion for initial impact by photoelectrons onto the microchannel plate, which said entrance portion over an entire surface area thereof has an electron emissivity coefficient greater than 1, said method comprising the steps of:

providing said microchannel plate with an electron-receiving face and an opposite electron-discharge face;

configuring said microchannel plate to define said plural microchannels therethrough opening onto both said electron-receiving face and said electron-discharge face and each defining a respective opening on said electron-receiving face and on said electron-discharge face;

defining said entrance portion within each of said plural microchannels adjacent to said electron-receiving face;

providing at each said entrance portion an initial electron-impact area which is angulated relative to a perpendicular from said electron-receiving face, and substantially having a perpendicular line of sight relation with the respective opening of the respective one of said plural microchannels on said electron-receiving face; and providing each said entrance portion angulated initial electron-impact area with an electron emissivity coefficient greater than one (1).

2. The method of claim 1 further including the steps of depositing a coating layer of conductive metallic electrode material having a secondary electron emissivity coefficient of less that one (1) on said electron-receiving face from an evaporative source for said conductive coating material; and positioning said evaporative source at a circumferentially variable angle with respect to respective central axes of said microchannels during deposition of said coating layer of material.

3. The method of claim 2 further including the steps of depositing said coating layer of conductive material also on a part of said entrance portion of said plural microchannels without depositing said conductive material on said angulated initial electron-impact area.

4. The method of claim 1 wherein said method further includes the steps of;

providing said microchannel plate with a glass substrate defining said electron-receiving face and said opposite electron-discharge face;

defining said plurality of microchannels with said substrate, each of said plurality of microchannels having said entrance portion which is defined by a first tubular cladding opening onto said electron-receiving face and extending toward said electron-discharge face, and a second tubular cladding disposed on an inner surface of said first cladding within the respective microchannel and spaced from said electron-receiving face and extending toward said electron-discharge face;

forming said first cladding and said second cladding of materials which are each substantially a nonmetallic material having a surface electron-emissivity coefficient greater than one (1);

providing a surface layer of said first cladding at said electron-receiving face which includes means of making said electron-receiving face sufficiently conductive to function as an electrically conductive electrode, whereby said surface layer of said first cladding is capable of distributing an electrostatic charge across said electron-receiving face of said microchannel plate.

5. The method of claim 4 further including the step of using a material which is substantially glass as said substantially non-metallic material.

6. The method of claim 4 further including the step of using glass containing bismuth to define said first tubular cladding.

7. A method for fabricating a microchannel plate having plural microchannels each with an entrance portion for initial impact by photoelectrons onto the microchannel plate, which said entrance portion over an entire surface area thereof has an electron emissivity coefficient greater than 1, said method comprising the steps of:

providing said microchannel plate with a glass substrate defining a respective electron-receiving face and a respective opposite electron-discharge face;

defining with said glass substrate said plurality of microchannels, each of said plurality of microchannels having said entrance portion which is defined by a first tubular cladding opening onto said electron-receiving face and extending toward said electron-discharge face and defining an opening at said electron-receiving face, and a second tubular cladding disposed on an inner surface of said first cladding within the respective microchannel and spaced from said electron-receiving face and extending toward said electron-discharge face;

providing at each said entrance portion an initial electron-impact area which is angulated relative to a perpendicular from said electron-receiving face, and substantially having a perpendicular line of sight relation with the respective opening of the respective one of said plural microchannels on said electron-receiving face; and providing each said entrance portion angulated initial electron-impact area with an electron emissivity coefficient greater than one (1);

further including the steps of forming said first cladding and said second cladding of respective materials which are each substantially a nonmetallic material having a surface electron-emissivity coefficient greater than one (1);

providing a surface layer of said first cladding at said electron-receiving face which includes means of making said electron-receiving face sufficiently conductive to function as an electrically conductive electrode; and employing said electrically conductive electrode function of said first cladding to distribute an electrostatic charge across said electron-receiving face of said microchannel plate.

8. The method of claim 7 further including the step of using a material which is substantially glass as said substantially non-metallic material.

9. The method of claim 7 further including the step of using glass containing bismuth to define said first tubular cladding.

10. A method for fabricating a microchannel plate having plural microchannels each with an entrance portion for initial impact by photoelectrons onto the microchannel plate, which said entrance portion over an entire surface area thereof has an electron emissivity coefficient greater than 1, said method comprising the steps of:

providing said microchannel plate with an electron-receiving face and an opposite electron-discharge face;

configuring said microchannel plate to define plural microchannels therethrough opening onto both said electron-receiving face and said electron-discharge face and each defining a respective opening on said electron-receiving face and on said electron-discharge face;

defining said entrance portion within each of said plural microchannels adjacent to said electron-receiving face;

providing at each said entrance portion an initial electron-impact area which is angulated relative to a perpendicular from said electron-receiving face, and substantially having a perpendicular line of sight relation with the respective opening of the respective one of said plural microchannels on said electron-receiving face; and applying a metallic electrode material which has a coefficient of secondary electron emissivity lower than one (1) over said electron-receiving face surrounding said openings of said plural microchannels on said electron-receiving face and extending also into each of said plural microchannels without covering said initial electron-impact area so that said initial electron impact area maintains said electron-emissivity coefficient greater than one (1).

11. The method of claim 10 further including the step of applying said metallic electrode material into said plural microchannels with a circumferentially varying angulation relative to the axes of said plural microchannels, and utilizing said circumferentially varying angulation to provide a circumferentially non-uniform depth of extension of said metallic electrode material into said plural microchannels from said electron-receiving face toward said electron-discharge face.

* * * * *